United States Patent [19]

Marek

[11] 3,746,948

[45] July 17, 1973

[54] SEMICONDUCTOR STRUCTURE INCORPORATING TUNNEL DIODES LOCATED IN THE PATH OF THE MAIN CURRENT FLOW

[75] Inventor: Alois Marek, Nussbaumen, Switzerland

[73] Assignee: Aktiengesellschaft Brown, Boveri & Cie, Baden, Switzerland

[22] Filed: May 18, 1971

[21] Appl. No.: 144,485

[30] Foreign Application Priority Data

May 26, 1970 Switzerland.......................... 7786/70

[52] U.S. Cl...... 317/235 R, 317/235 K, 317/235 L, 317/235 AA, 317/235 AB, 317/235 AD, 307/305, 307/322

[51] Int. Cl.......................... H01l 11/00, H01l 15/00

[58] Field of Search ..................... 317/235 K, 235 L, 317/235 AA, 235 AB; 307/252 L, 384, 305, 286, 322

[56] References Cited

UNITED STATES PATENTS

| | | | |
|---|---|---|---|
| 2,899,646 | 8/1959 | Read | 317/235 AB |
| 3,176,147 | 3/1965 | Miller | 317/235 AB |
| 3,196,330 | 7/1965 | Moyson | 317/234 K |
| 3,236,698 | 2/1966 | Shockley | 317/235 K |
| 3,265,909 | 8/1966 | Gentry | 317/235 AB |
| 3,284,639 | 11/1966 | Giuliano et al. | 317/235 AB |
| 3,434,023 | 3/1969 | Lesk | 317/235 AB |
| 3,609,413 | 9/1971 | Lane | 317/235 AB |
| 3,280,333 | 10/1966 | Hyman et al. | 307/286 |
| 3,398,334 | 8/1968 | Shockley | 317/235 AD |
| 3,459,967 | 8/1969 | Tummers et al. | 317/235 L |
| 3,641,403 | 2/1972 | Nakata | 317/235 AB |

FOREIGN PATENTS OR APPLICATIONS

| | | | |
|---|---|---|---|
| 1,286,645 | 1/1969 | Germany | 317/235 L |

*Primary Examiner*—John W. Huckert
*Assistant Examiner*—Andrew J. James
*Attorney*—Pierce, Scheffler & Parker

[57] ABSTRACT

A semiconductor element comprises a disc of semiconductor material which includes at least four active layers of alternatively opposite conductivity type having attached metallic electrodes to each of the outside layers. In order to avoid the local over-heating in small regions of the active part of the element there are arranged at least two tunnel junctions between at least three consecutive layers in the main current path and the said three consecutive layers are attached to the layer or the layer junction which determines the current density of the device.

1 Claim, 3 Drawing Figures

Patented July 17, 1973 3,746,948

Figure 1:
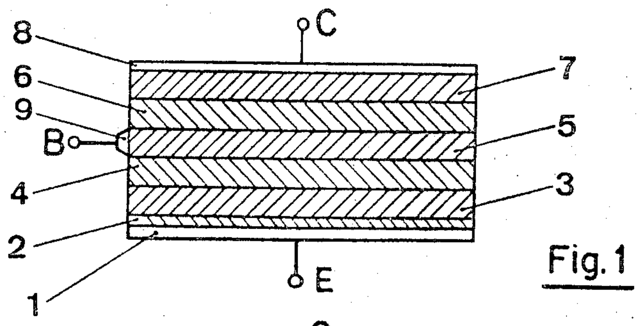

SEMICONDUCTOR STRUCTURE INCORPORATING TUNNEL DIODES LOCATED IN THE PATH OF THE MAIN CURRENT FLOW

The present invention relates to improvements for a semiconductor element comprising a disc of semiconductor material which includes at least four active layers of alternately opposite conductivity type having attached metallic electrodes to each of the outside layers.

A phenomen limiting essentially the reliability and useful life of semiconductor devices, especially of high-power ones, is the local overheating of small regions inside the active part of the device, called "hot spots." Due to the local temperature rise the local electrical conductivity increases together with the electrical current density. The consequence of such an electrothermal positive feed-back inside the active part of the device — it is called the secondary breakdown — may be the full destruction of the semiconductor element.

A known way of extending the secondary-breakdown-free region of operating conditions of power transistors is to connect the periphery of the emitter area with the emitter terminal by means of a flat thin resistive metallic film. This way suffers from the following disadvantages:

first this ohmic resistance lying in the main current path trough the semiconductor structure decreases the total current density, because if the current density is to be held below a safe limit in all emitter regions, then it is well below this safe limit in most of the emitter regions, and the current-carrying capability of the semiconductor structure cannot be exploited in full, and secondly, the voltage drop on this resistance decreases the allowed power dissipation for the active part of the semiconductor structure if the total maximum dissipation of the semiconductor structure is taken as a constant (determined by the particular semiconductor structure and exterior cooling means).

The object of the present invention is to eliminate the disadvantages of the known expedients for eliminating hot spots and to provide a semiconductor element in which the current density is limited without sacrificing essentially the mean current density and without prohibiting an increase in the heat dissipation.

The semiconductor element according to the invention is characterized in that at least two tunnel junctions between at least three consecutive layers are arranged in the main current flow path through the semiconductor structure and the said three consecutive layers are attached to the layer or layer junction which determines the current density of the semiconductor structure. The at least two tunnel junctions comprise at least one limiting tunnel junction, or a tunnel junction which exhibits a concave and a supra-linear part of its current-voltage I(V) characteristic. This limiting junction is oriented in such a direction that the main current of the semiconductor structure having a polarity and a magnitude range considered as potentially dangerous due to the secondary breakdown flows through at least one of the limiting tunnel junctions in the direction in which this limiting tunnel junction exhibits the concave characteristic. The exact type of this characteristic may be chosen according to the application needs.

The determination of the particular limiting tunnel diode characteristics may be reached in a known way by a suitable choice of geometry and doping of the layers forming this limiting tunnel diode.

For example, in the case of a power transistor with an additional tunnel junction in the main current flow path, it is recommended to arrange this limiting tunnel junction between the emitter of the transistor structure proper and the emitter terminal of the device.

Figure 2:
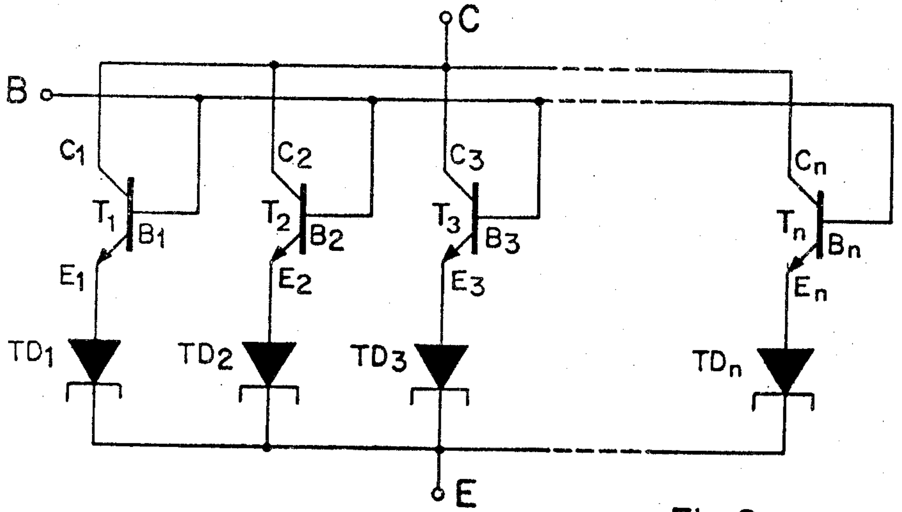
Figure 3:
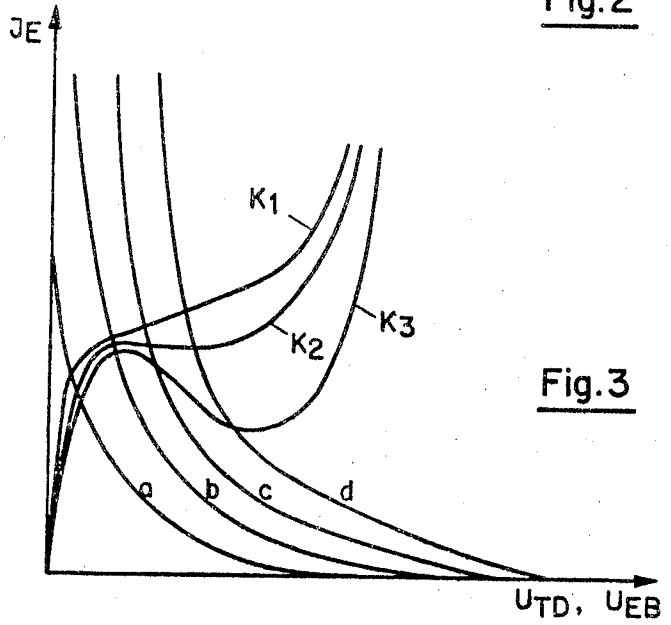

The invention will be described more fully on the basis of a transistor with $n^+$-p-i-n structure that is shown in the accompanied drawing. wherein:

FIG. 1 illustrates in section an example of a semiconductor device, i.e. a power transistor, with integrated limiting tunnel junction structure according to the present invention, FIG. 2 illustrates an equivalent circuit of the semiconductor device according to FIG. 1, and FIG. 3 illustrates a graphical presentation of the way of working of the semiconductor device according to FIG. 1.

Referring to FIG. 1 there is shown the schematic construction of a transistor with integrated limiting tunnel diode. The transistor terminals for the emitter, base, and collector are designated E, B, and C. The main current flow path between emitter and collector goes trough the metallic electrode 1, the $n^+$-layer 2 forming the cathode of the limiting tunnel junction, the $p^+$-layer 3 forming the anode of the limiting tunnel junction, and simultaneously the anode of an auxiliary tunnel junction, the $n^+$-layer 4 forming the cathode of the auxiliary tunnel junction and simultaneously the emitter of the transistor. The main current goes furthermore through the base layer 5, the intrinsic layer 6, the collector layer 7, and through the metallic electrode 8. The metallic electrodes 1 and 8 are connected respectively with the emitter terminal E and the collector terminal C respectively. The base terminal B is connected with another electrode 9 alloyed to the base layer 5.

The equivalent circuit of this construction described above is shown in FIG. 2. The foundation for this equivalent circuit is subdividing the semiconductor device into a finite number of partial transistors $T_1, \ldots, T_n$ having their emitters $E_1, \ldots, E_n$ connected in series with the respective partial limiting tunnel diodes $TD_1, \ldots, TD_n$. Here the partial limiting tunnel diodes are connected in the same forward direction as partial limiting tunnel diodes are connected to the emitters of their respective transistors. All the partial collectors $C_1, \ldots, C_n$ are connected to a common collector terminal C, and similarly all the partial bases $B_1, \ldots, B_n$ are connected to the base terminal B. All the cathodes of the partial tunnel diodes are connected to the common emitter terminal E.

Exactly speaking, the anodes of the partial limiting tunnel diodes are not connected directly to the respective emitters of the partial transistors, but they are connected via the partial auxiliary diodes formed by parts of the auxiliary tunnel junction between the $p^+$-layer 3 and the $n^+$-layer 4. These mentioned tunnel diodes are not shown in FIG. 2.

The main current through the semiconductor, however, if it flows in the "forward" direction through the transistor structure flows in the "back" direction through the auxiliary tunnel junction. As its d.c. characteristic in this direction exhibits very low voltages even at very high currents, we will neglect fully the influence of this voltage on the overall behavior of the semiconductor structure. For simplicity sake we will not explicitely mention this or these tunnel junctions at all, although their bare existence may be dictated by pure technological considerations, because they are simpler than an inter-layer ohmic contact of other nature.

On order to avoid confusion with known semiconductor devices containing simultaneously tunnel and normal semiconductor junctions integrated in one crystal, let us mention that formally the known devices comprise exactly one pair of degenerate layers forming one tunnel junction which may be or may not be in the main current path. In an equivalent circuit they are transistors or composite transistor structures (thyristors) having a tunnel diode in parallel with a normal — may be formally vanishing — emitter base junction, supplying thus bistability to the control input of the device. Functionally they are not intended to alter the current density distribution at all. Sometimes the tunnel junctions are positioned sideways to the main current path.

Another formal and functional difference is that the known devices with an integrated tunnel junction do need electrical connections from outside terminals to both sides of the tunnel junction. In our case here this is not so and thus the tunnel junctions may be formed by very thin layers as lateral conductivity of some layers here is undesired.

In order to explain the way of working of the semiconductor device according to the present invention let us consider FIG. 3. Here are represented the $I_E$–$U_{EB}$ characteristics of a transistor at various junction temperatures (curves *a*,*b*, and *c*) together with the I–U characteristics of tunnel diodes of various types.

Let us assume that the junction temperature of the considered transistor increases due to any reason. Then the emitter-base d.c. characteristic changes, too, say from curve a to curve *c*. As a consequence of the form of the tunnel diode characteristic the voltage drop on the limiting tunnel diode will increase, too. The emitter current, however, will not exceed a certain value determined by the limiting tunnel diode.

Assuming the limiting tunnel diode characteristic $K_1$ in FIG. 3, the current rise due to the temperature rise is essentially lower than the current rise in the known arrangements with a linear resistor connecting the transistor emitter with the device emitter terminal.

Assuming the limiting tunnel diode characteristic according to curve $K_2$ in FIG. 3, a temperature rise will result in no essential current rise in the region of interest. The limiting tunnel diode acts as a device limiting the emitter current $I_E$.

In the case of the characteristic $K_3$ in FIG. 3, a temperature rise will result in a current fall so far as the so-called peak voltage $U_p$ of the tunnel diode has been exceeded. In this working area a transistor with an integrated tunnel diode might exhibit an electrical instability. The cooperation of the remaining partial transistors, however, compensates such an effect, supposing that up to the peak device current the summarized characteristics of all partial limiting tunnel diodes taken together exhibits a positive differential resistance. Such a behavior may be reached in applying the doping and tunnel junction geometry in a known way.

The subject matter of the present invention is not limited to that represented in the drawing. In such a way other semiconductor devices other than transistors, e.g., diodes, thyristors, etc. may be equipped with additional limiting tunnel junctions in accordance with the invention.

I claim:

1. A semiconductor element having the function of a transistor and having a plurality of contacting layers alternating with respect to their respective types of conductivity comprising a first metallic layer serving as a contact electrode and as the emitter terminal of the transistor, a second highly doped $n^+$-layer adjacent said first layer forming the cathode of a first tunnel diode located in the path of the main current flow through the transistor, a third highly doped $p^+$-layer adjacent said second layer forming the anode of said first tunnel diode and which functions simultaneously as the anode of a second tunnel diode likewise located in the path of the main current flow through the transistor, a fourth highly doped $n^+$-layer adjacent said third layer forming the cathode of said second tunnel diode and which functions simultaneously as the emitter of the transistor having a $n^+$-p-i-n structure, a fifth p-layer adjacent said fourth layer and which forms the base of the transistor, a sixth intrinsic layer adjacent said fifth layer, a seventh n-layer adjacent said sixth layer which functions as the collector of the transistor, and an eighth metallic layer adjacent said seventh layer which functions as a contact electrode and as the collector terminal for the transistor.

* * * * *